US 6,670,859 B2

(12) United States Patent
Sanduleanu

(10) Patent No.: US 6,670,859 B2
(45) Date of Patent: Dec. 30, 2003

(54) DIFFERENTIAL RING OSCILLATOR STAGE

(75) Inventor: Mihai Adrian Tiberiu Sanduleanu, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/218,230

(22) Filed: Aug. 13, 2002

(65) Prior Publication Data

US 2003/0034850 A1 Feb. 20, 2003

(30) Foreign Application Priority Data

Aug. 16, 2001 (EP) ............................................ 01203123

(51) Int. Cl.$^7$ ............................................ H03B 27/00
(52) U.S. Cl. ............................ 331/57; 327/52; 327/65; 330/252; 330/254
(58) Field of Search ............................ 331/57; 327/52, 327/55, 65, 67; 330/261, 273, 267, 268, 252, 254

(56) References Cited

U.S. PATENT DOCUMENTS

| 4,829,506 A | | 5/1989 | Bressers et al. ............. 369/112 |
|---|---|---|---|
| 4,871,933 A | * | 10/1989 | Galbraith ..................... 327/53 |
| 5,262,690 A | * | 11/1993 | Cochran et al. ............. 327/264 |
| 5,416,369 A | * | 5/1995 | Fong et al. ................... 327/65 |
| 5,648,734 A | * | 7/1997 | Tanabe et al. ............... 326/115 |
| 5,691,699 A | | 11/1997 | Vane et al. ................... 340/578 |
| 5,917,383 A | | 6/1999 | Tso et al. ..................... 331/57 |
| 6,034,570 A | | 3/2000 | Warwar ........................ 331/57 |
| 6,208,212 B1 | | 3/2001 | White .......................... 331/57 |

\* cited by examiner

*Primary Examiner*—Timothy P. Callahan
*Assistant Examiner*—An T. Luu
(74) *Attorney, Agent, or Firm*—Aaron Waxler

(57) ABSTRACT

The present invention relates to a differential ring oscillator stage, comprising differential delay means (Q1, Q2) having a first input (IN+) and an inverse second input (IN−) and a first output and an inverse second output, a first output buffer means (34a) having its input connected to the first output of said delay means (Q1, Q2), and a second output buffer means (34b) having its input connected to the second output of said delay means (Q1, Q2), and further comprising a first controllable current source means (M6) which is connected to the output (OUT+) of said first output buffer means (34a) and controlled in accordance with the signal from said second output of said delay means (Q1, Q2), and a second controllable current source means (M5) which is connected to the output (OUT−) of said second output buffer means (34b) and controlled in accordance with the signal from said first output of said delay means (Q1, Q2), said controllable current source means (M5, M6) supplying currents to the outputs (OUT+, OUT−) of said output buffer means (34a, 34b) such that within the working range the wave form of the currents is essentially proportional to the wave form of the signals from the outputs of said delay means (Q1, Q2).

8 Claims, 4 Drawing Sheets

DIFFERENTIAL RING OSCILLATOR STAGE

The present invention relates to a differential ring oscillator stage, comprising differential delay means having a first input and an inverse second input and a first output and an inverse second output, a first output buffer means having its input connected to the first output of said delay means, and a second output buffer means having its input connected to the second output of said delay means.

Ring oscillators are widely known in the field of integrated circuit manufacture and usually comprise simple inverting logic circuits as stages. The current output of each stage takes a certain time to charge or discharge an input capacitance of the following stage to a threshold voltage. The stages are connected in series to form a cascade loop, so that at a certain frequency a 180° phase shift is imparted to signals passing around the loop. Provided the loop gain is large enough, the signals soon become non-linear resulting in square-wave oscillations which can be used for a variety of purposes, in particular for digital signal processing.

In metal-oxide-semiconductor (MOS) integrated circuits, ring oscillators are commonly used to drive charge pump circuits. In particular, ring oscillators are provided in BiCMOS or Bipolar and also in pure CMOS circuits. A preferred application of ring oscillators is the provision in data and clock recovery circuits or in PLL circuits.

U.S. Pat. No. 5,412,349 A discloses a PLL based deskewed clock generator. The clock generator comprises a phase frequency detector, a charge pump, a loop filter and a voltage controlled oscillator from which the internal clock is generated. The voltage controlled oscillator is based on a five stage ring oscillator where each stage is a differential current controlled delay cell. The delay through each cell is a function of the tail current through a p-channel differential source coupled pair, the differential voltage swing between the first output and the inverse second output, and the capacitive load on the first and second outputs. The voltage swing in the delay cell is held constant and independent of the supply voltage by utilizing voltage controlled resisters in the delay stage, a power supply insensitive voltage swing reference generator, a feedback replica biasing circuit and a voltage to current converter. The differential signal outputted form the ring oscillator is fed to a buffer amplifier which is implemented as a differential amplifier and converts the differential signal to a single ended highspeed clock signal.

U.S. Pat. No. 5,691,669 A discloses dual adjust current-controlled phase locked loop which is provided for a allowing multiple-gain frequency acquisition of a signal. The dual adjust current-controlled phase locked loop includes a phase detector responsive to a reference signal and a synthesized signal for producing a phase error signal, a controller responsive to the phase error signal for generating coarse and fine adjust control signals, and a dual adjust current-controlled oscillator responsive to the coarse and fine adjust control signals for adjusting the oscillating frequency of the synthesized signal. The dual adjust current-controlled oscillator includes a differential current-controlled ring oscillator comprising a series of delay elements. Each delay element includes a high gain circuit responsive to the coarse adjust control signal and a low gain circuit responsive to the fine adjust control signal.

In order to achieve a high oscillator frequency in the GHz range, an obvious choice would be to limit the number of stages to two. The oscillator frequency can be varied by changing the delay per stage and if one can ensure a fine and a coarse tuning mechanism, then the oscillator will have two tuning ports. In optical networking application for applications above 10 GB/s low phase noise is essential to recover the clock in a Data and Clock Recovery circuit (DCR) with the additional requirement that the oscillator should provide an oscillation frequency stable with temperature and process variations. For some applications with more than one Data rate, a large tuning range oscillator is required. The linearity of the oscillator is also important for the reason of keeping the loop bandwidth of the PLL constant for different tuning situations.

The first and second output buffer means defining the differential output buffer means are included in the differential ring oscillator stage in order to provide a level shifting operation and to minimize the loading effect of the next stage. Since the signals in question are digital signals and consist of a series of pulses, the waveform of such pulses should be rectangular and, consequently, their edges should be vertical. However, due to certain physical effects the leading edges need a certain time to rise and the trailing edges need a certain time to fall, so that in reality the waveform of the pulses is not rectangular, but trapezoidal. Such a deviation from the ideal case of a rectangular waveform is basically not a problem in case the zero-crossings are interesting only. However, in particular due to the currents of parasitic capacitances at the outputs, the waveform of the signal is not symmetrical, but becomes asymmetrical wherein the fall-time of the trailing edges are longer than the rise-time of the leading edges. This effect results in phase noise and jitter which is a big disadvantage since an exact detection of the zero-crossings is not possible. In particular, at large signal amplitudes the current at the outputs saturate which leads to a very high asymmetry of the waveform.

It is an object of the present invention to provide a differential ring oscillator stage having reduced phase noise and jitter.

In order to achieve this and other objects, in accordance with the present invention, there is provided a differential ring oscillator stage, comprising differential delay means having a first input and an inverse second input and a first output and an inverse second output, a first output buffer means having its input connected to the first output of said delay means, and a second output buffer means having its input connected to the second output of said delay means, further characterised by a first controllable current source means which is connected to the output of said first output buffer means and controlled in accordance with the signal from said second output of said delay means, and a second controllable current source means which is connected to the output of said second output buffer means and controlled in accordance with the signal from said first output of said delay means, said controllable current source means supplying currents to the output of said output buffer means such that within the working range the waveform of the currents is essentially proportional to the waveform of the signal from the output of said delay means.

The construction of the present invention leads to the advantage that the fall-time of the trailing edges of the output signals from the output buffer means is shortened and adapted to the rise-time so that the fall-time is equal to the rise-time of the edges and the waveform of the output signal becomes symmetrical. This is achieved by that in each output buffer means additional current is generated by the controllable current source means in accordance with the inverse output signal from the delay means, respectively so as to shorten the fall-time of the trailing edge of the output signal from the output buffers. In other words, in each output buffer means the waveform of the trailing edge of its output signal is controlled by the leading edge of the inverse output signal from the delay means, respectively, so as to make the waveform of the trailing edge of the output signals from the output buffer means equal to the waveform of the leading edge of the inverse output signals from the delay means and, thus, to the waveform of the leading edge of the output signals from the output buffer means, accordingly. The currents flowing through the output buffer means cannot saturate. A further advantage over the prior art is that due to the construction of the present invention the output buffer means have a gain higher than 1.

After all, the present invention allows the provision of output signals with larger amplitudes and equal rise-fall-times which results in a reduction of the phase noise.

In a preferred embodiment of the present invention, the first controllable current source comprises a transistor, preferably a MOS transistor, having its base connected to said second output of said delay means, its emitter applied to a predetermined potential and its collector connected to the output of said first output buffer means. Moreover, the second controllable current source comprises a transistor, preferably a MOS transistor, having its base connected to said first output of said delay means, its emitter applied to a predetermined potential and its collector connected to the output of said second output buffer means, wherein said predetermined potential is preferably zero (ground). These embodiments provide a simple construction wherein the waveform of the output signals from the output buffers is still symmetrical if such transistors go into the linear region.

The above and other objects and features of the present invention will become clear from the following description taken in conjunction with the preferred embodiment with reference to the accompanying drawings in which.

Figure 4:
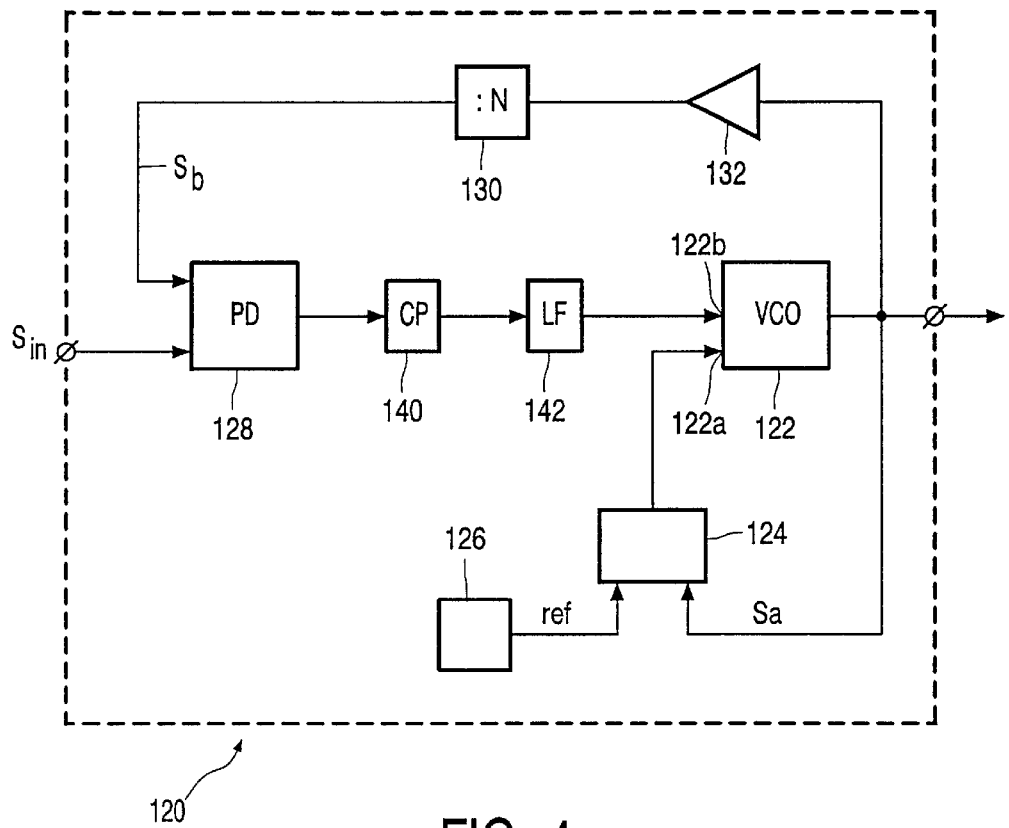
Figure 5:
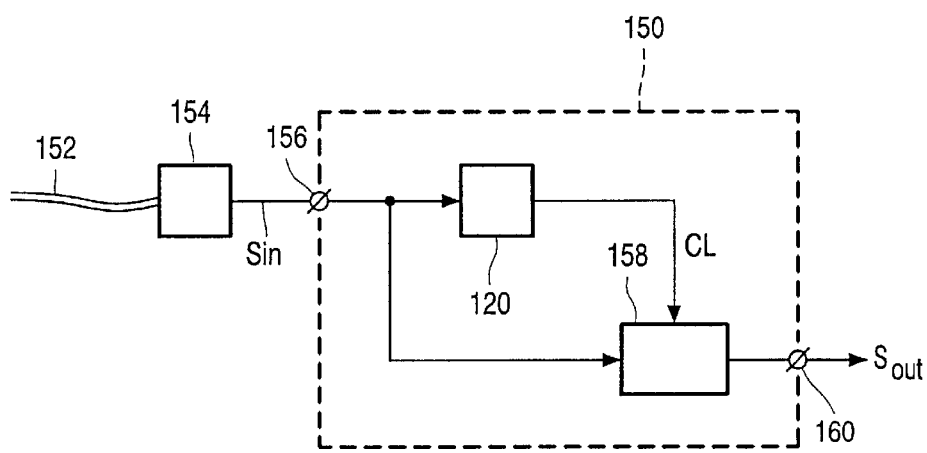
Figure 6:
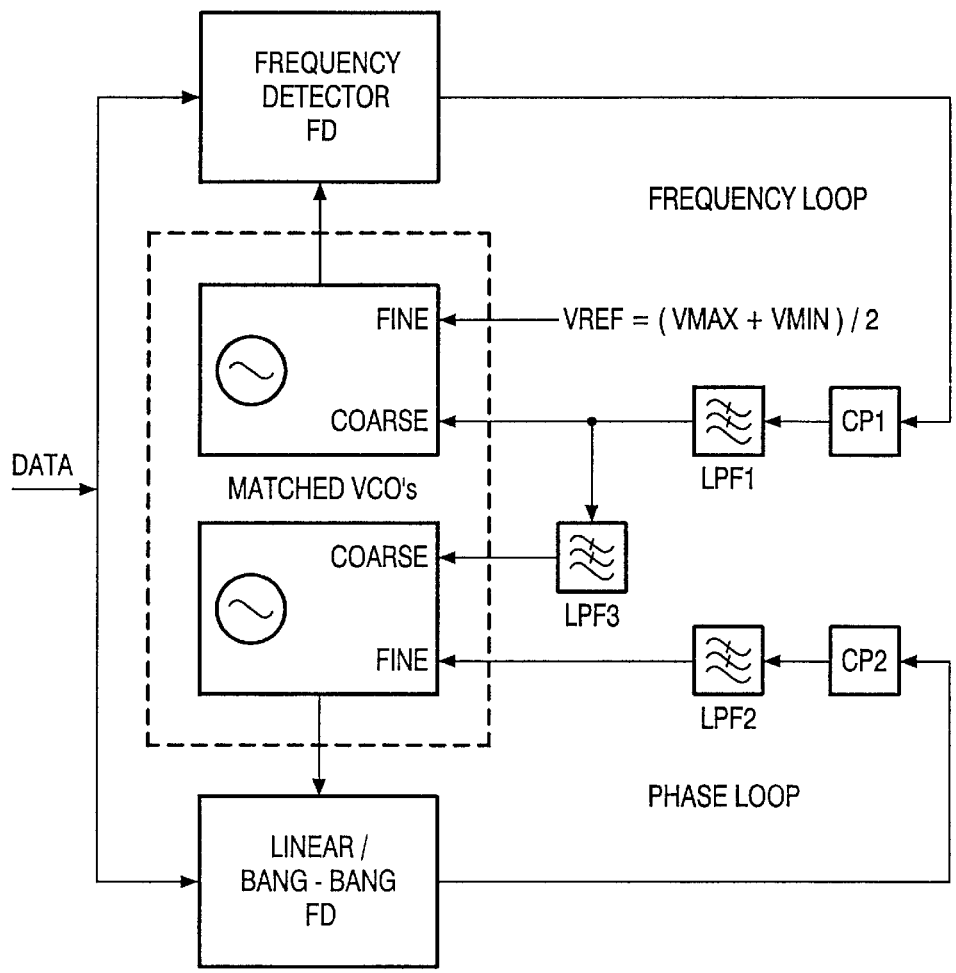

FIG. 4 a preferred embodiment of a clock recovery circuit including an oscillator;

FIG. 5 a preferred embodiment of a receiver for a fiber-optic channel including the clock recovery circuit of FIG. 4; and FIG. 6 a further preferred embodiment of a data and clock recovery unit including two oscillators.

Figure 1:
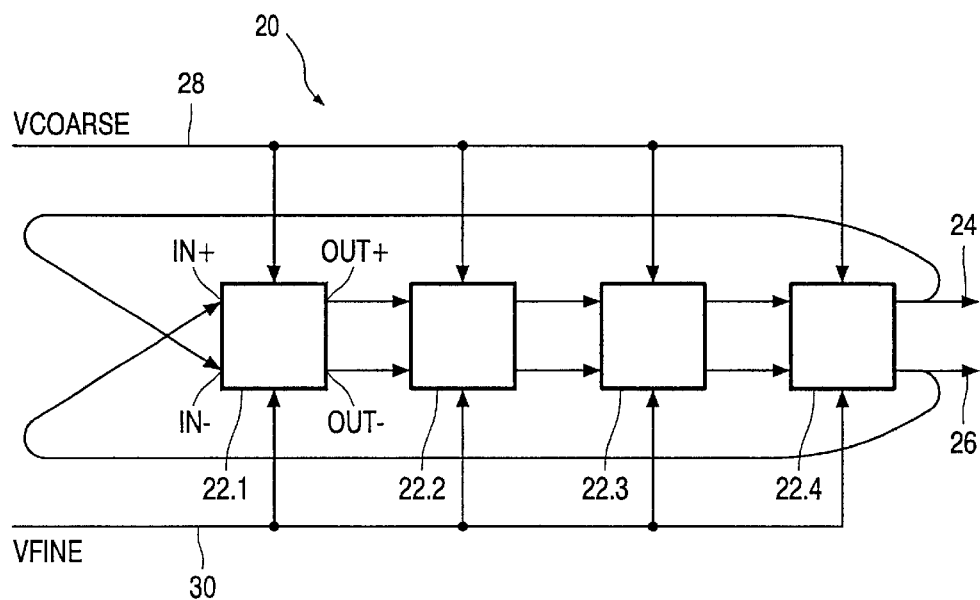
FIG. 1 is a schematic block diagram of a differential ring oscillator.

FIG. 1 shows a schematic block diagram of a differential ring oscillator 20 which comprises a series of differential ring oscillator cells or stages 22.1 to 22.4 connected in series. As shown in FIG. 1, each stage comprises a first input IN+, a complemented or inverse second input IN−, a first output OUT+ and a complemented or inverse second output OUT−, wherein the inverse second input IN− is substantially the complement of the first input IN+ and the inverse second output OUT− is substantially the complement of the first output OUT+. As further shown in FIG. 1, the first output of the last stage 22.4 in the series of stages is connected to the inverse second input of the first 22.4, and the inverse second output of the last stage 22.1 is connected to the first input of the first stage 22.1, so as to form a ring. Moreover, the first output of the last stage 22.4 is connected to a first output terminal 24 of the oscillator 20, and the inverse second output of the last stage 22.4 is connected to a second output terminal 26 of the oscillator 20. So, at the first output terminal 24 of the oscillator 20 a first output signal is outputted, and at the second output terminal 26 of the oscillator 20 an inverse second output signal is outputted, wherein the inverse second output signal is substantially a complement of the first output signal.

In the embodiment shown in FIG. 1, the number of stages used is four. Since this is an even number and the inverse second output OUT− of each stage 22.1 to 22.4 of this embodiment generates an output signal having a phase shift of 180° with regard to the output signal outputted at the first output OUT+, the respective first and second output signals from the last stage 22.4 are used as the inverse second input signal and first input signal of the first stage 22.1, respectively, as already mentioned above. Because of the differential nature of each stage, any number of stages may be used to provide the ring oscillator. In contrast thereto, if an odd number of differential stages is used, the respective first and second output signals from the last stage in the series of stages are used as the respective first and second input signals of the first stage.

As also shown in FIG. 1, a coarse tuning control input 28 is provided for inputting a coarse tuning signal "VCOARSE", and a fine tuning control input 30 is provided for inputting a fine tuning signal "VFINE". By changing the coarse tuning signal "VCOARSE", the frequency of the oscillator 20 is varied over a large tuning range, wherein the change of the fine tuning signal "VFINE" additionally allows the fine tuning of the frequency of the oscillator 20.

Usually, a minimal ring oscillator of the kind as shown in FIG. 1 consists of two stages which provide a delay $t_D$ at the oscillation frequency. In order to satisfy the phase oscillation condition around the loop, it can be shown that the frequency of operation is:

$$f_0 = \frac{1}{2t_D} \qquad (1).$$

It should be noted here that in the theoretical case the implementation of the inverting stages provides a 180° phase shift on the loop. However, there is always some phase shift due to parasitics which must be compensated for. Such compensation can be provided e.g. by using a delay on the transmission line.

Figure 2:
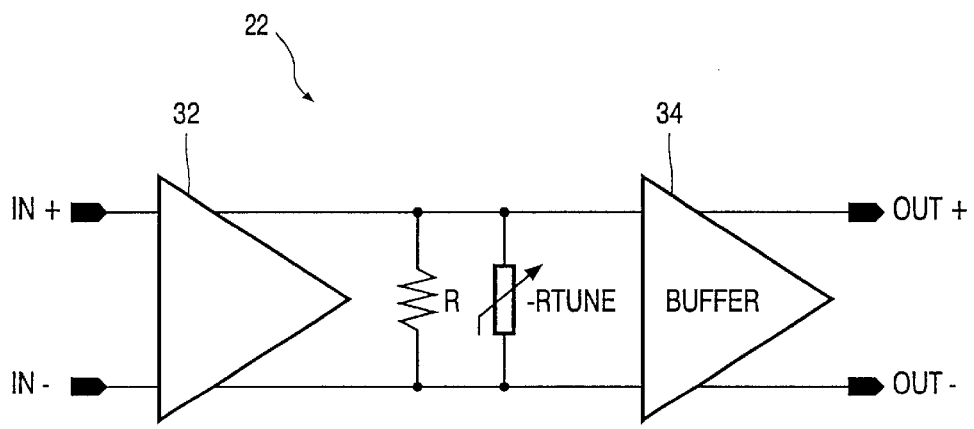
FIG. 2 is a schematic block diagram of a preferred embodiment of a differential ring oscillator stage according to the present invention.

FIG. 2 shows a schematic block diagram of a differential ring oscillator stage in accordance with a preferred embodiment of the present invention. The differential ring oscillator stage 22 shown in FIG. 2 comprises a differential delay element 32 which delays the first and inverse second input signals inputted into the first input IN+ and the inverse second input IN−, respectively. The differential delay element 32 can consist of a differential inverter and/or a differential gain amplifier. In order to provide a level shifting operation and to minimize the loading effect of the next stage, a differential output buffer 34 is provided. The first input and the inverse second input of the differential output buffer 34 are connected to the first output and the inverse second output of the differential delay element 32, respectively, wherein the first output and the inverse second output of the differential output buffer 34 define the first output terminal OUT+ and the inverse second output terminal OUT− of the differential ring oscillator stage 22, respectively.

Further provided are an adjustable load consisting of an adjustable positive resistor R, and an adjustable negative resistor −RTUNE. The positive and negative resistors are coupled in parallel between a first junction connecting a first output of the differential delay element 32 and the corresponding input of the differential output buffer 34 and a second junction connecting the inverse output of the differential delay element 32 and the inverse input of the differential output buffer 34.

The main time constant in the oscillator results from the parallel combination of the positive and negative resistors and the parasitic capacitance 'seen' in parallel by the load. By tuning the negative resistance −RTUNE, the delay per oscillator stage is tuned and therefore the oscillator frequency is changed. However, when tuning also the positive resistance R, then a two-tuning mechanism is provided.

The oscillator consisting of the oscillator stages as described here can be preferably realised in SiGe technology for high frequency operation, and it can be tuned in the range of 4 to 14 GHz which is needed in a 10 GB/s system in order to accommodate also the forward error correction (FEC) data rates.

Figure 3:
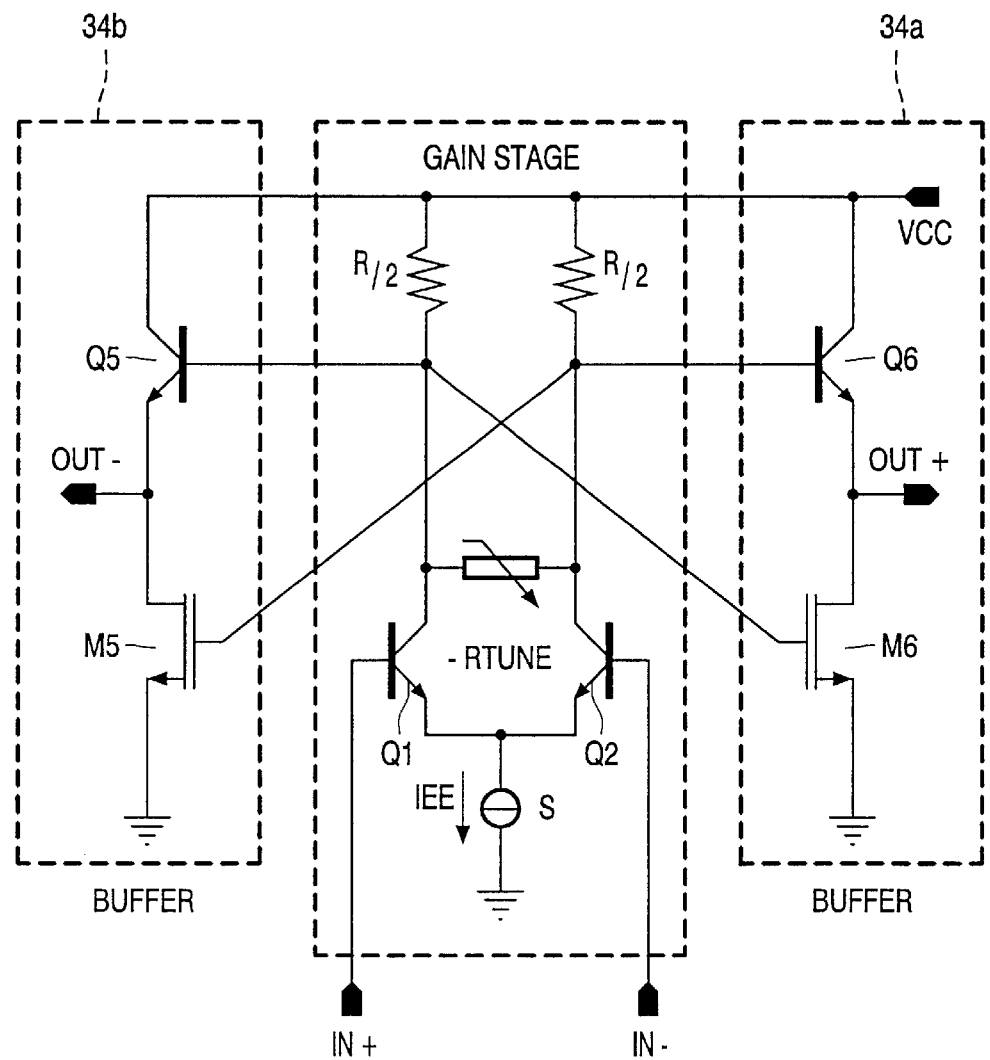
FIG. 3 is a schematic circuit diagram of the differential ring oscillator stage of FIG. 2.

FIG. 3 shows the implementation of a gain stage which is defined by the delay element 32, the positive resistor R and the negative resistor −RTUNE of FIG. 2, wherein the delay element 32 of FIG. 2 is essentially defined by transistors Q1 and Q2 and a MOS controlled current source S. As further shown in FIG. 3, the differential output buffer 34 of FIG. 2 consists of a first output buffer 34a and an inverse second output buffer 34b. The gain stage comprises a differential pair of positive resistors R/2 and the negative resistor −RTUNE followed by an emitter follower (defined by the transistors Q1 and Q2) with the current source S.

The first output buffer 34a comprises a transistor Q6 with its base connected to the first output of the gain stage, its collector applied to a supply voltage VCC and its emitter connected to the first output OUT+. The second output buffer 34b comprises a transistor Q5 with its emitter connected to the inverse second output of the gain stage, its collector applied to the supply voltage VCC and its collector connected to the inverse second output OUT−.

Moreover, the first output buffer 34a comprises a MOS transistor M6 with its gate connected to the inverse second output of the gain stage, its source connected to the first output OUT+ and its drain applied to ground. The MOS transistor M6 defines a first controllable current source which is controlled in accordance with the signal from the inverse second output of the gain stage. In a similar manner, the second output buffer 34b comprises a MOS transistor M5 with its gate connected to the first output of the gain stage, its source connected to the inverse second output OUT− and its drain applied to the ground. Accordingly, the MOS transistor M5 defines a second controllable current source which is controlled in accordance with the signal from the first output of the gain stage.

The MOS transistors M5 and M6 in the output buffers 34a, 34b provide a feed-forward control at the first output OUT+ and the inverse second output OUT−. Due to this configuration, the gain of the output buffer 34 is slightly higher than 1 dB, but the main advantage consists in the fact that the output buffers 34a and 34b are able to deliver more current to a capacitive load such that slewing effects at the outputs OUT+ and OUT− can be reduced. In a normal emitter follower, the constant current source in the emitter determines unequal rise and fall times. In an oscillator, this translates in non-symmetrical waves at the output which can worsen the phase noise. Since this oscillator provides sinusoidal, symmetrical waveforms at the output, the 1/f noise corner in the phase-noise spectrum is pushed towards the carrier minimizing the close-in phase noise of the oscillator. Also the noise coming from the up-conversion mechanisms is reduced.

The advent of fiber optic communications has brought fully integrated optical receivers in which low-power becomes a must in order to cope with higher integration densities and the limited thermal capabilities of existing packages. At the receiver side, data and clock recovery units (DCR), usually PLL based, are needed to recover the clock information and to retime the incoming data.

FIG. 4 shows a preferred embodiment of a clock recovery circuit 120 which comprises a voltage controllable oscillator 122 of the kind as described above. The controllable oscillator 122 is part of a frequency locked loop further including a control signal generator 124. The controllable oscillator 122 has a coarse tuning port 122a which is coupled to the control signal generator 124 and corresponds to the coarse tuning control input 28 of FIG. 1. The control signal generator 124 receives a reference signal Sref from a reference signal generator 126, such as a crystal. The controllable oscillator 122 also forms part of a phase locked loop which comprises a phase detector 128 for generating a phase difference signal Sd which is indicative for a phase difference between an input signal Sin and a feedback signal Sb. The feedback signal Sb is obtained by a frequency divider 130 from the output signal of the controllable oscillator 122. Further, the clock recovery circuit 120 of FIG. 4 includes a charge pump 140 which receives the output signal from the phase detector 128 at its input and is connected with its output to a low-pass-filter 142 whose output is coupled to a fine tuning port 122b of the controllable oscillator 122 which fine tuning port corresponds to the fine tuning control input 30 of FIG. 1.

FIG. 5 shows a preferred embodiment of a receiver 150 for a fibre-optic channel 152. The receiver 150 comprises an input 156 for receiving an input signal Sin from a sensor 154 which is coupled to the fibre-optic channel 152. The receiver 150 of FIG. 5 further includes the clock recovery circuit 120 of FIG. 4 which is coupled to the input 156 for receiving the input signal Sin as reference signal. A data recovery circuit 158 is coupled to the clock recovery circuit 120 and to the input 156 and comprises an output 160 which generates a digital output signal Sout in response to the input signal Sin.

FIG. 6 shows a further preferred embodiment of a data and clock recovery unit comprising a frequency locked loop and a phase locked loop. The data and clock recovery unit of FIG. 6 comprises matched voltage-controllable oscillators wherein the one controllable oscillator is part of the frequency loop and the other controllable oscillator is part of the phase locked loop. Further, the data and clock recovery unit of FIG. 6 comprises two charge pumps wherein the one charge pump CP1 is included in the frequency locked loop and the other charge pump CP2 is included in the phase locked loop. Moreover, the data and clock recovery unit of FIG. 6 comprises low-pass filters wherein the one low-pass filter LPF1 is included in the frequency locked loop and the other low-pass filter LPF2 is included in the phase locked loop.

What is claimed is:

1. Differential ring oscillator stage, comprising
   differential delay means (32, Q1, Q2) having a first input (IN+) and an inverse second input (IN−) and a first output and an inverse second output,
   a first output buffer means (34a) having its input connected to the first output of said delay means (32, Q1, Q2), and
   a second output buffer means (34b) having its input connected to the second output of said delay means (32, Q1, Q2), further characterized by a first controllable current source means (M6) which is connected to the output (OUT+) of said first output buffer means (34a) and controlled in accordance with the signal from said second output of said delay means (32, Q1, Q2), and a second controllable current source means (M5) which is connected to the output (OUT−) of said second output buffer means (34b) and controlled in accordance with the signal from said first output of said delay means (32, Q1, Q2), said controllable current source means (M5, M6) supplying currents to the outputs (OUT+, OUT−) of said output buffer means (34a, 34b) such that within the working range the wave form of the currents is essentially proportional to the wave form of the signals from the outputs of said delay means (32, Q1, Q2).

2. Differential ring oscillator stage in accordance with claim 1, characterized in that the first controllable current source means comprises a transistor, preferably a MOS transistor (M6), having its gate connected to said second output of said delay means (32, Q1, Q2), its drain applied to a predetermined potential and its source connected to the output (OUT+) of said first output buffer means (34a).

3. Differential ring oscillator stage in accordance with claim 1, characterized in that the second controllable current source means comprises a transistor, preferably a MOS transistor (M5), having its gate connected to said first output of said delay means (32, Q1, Q2), its drain applied to a predetermined potential and its source connected to the output (OUT−) of said second output buffer means (34b).

4. Differential ring oscillator stage in accordance with claim 2, characterized in that said predetermined potential is zero (ground).

5. Ring oscillator comprising at least one differential ring oscillator stage in accordance with claim 1.

6. Clock recovery circuit comprising an oscillator in accordance with claim 5.

7. Clock recovery circuit according to claim 6, comprising a controllable oscillator means which includes at least one oscillator and is part of a frequency locked loop and of a phase locked loop.

8. A receiver (150) for a fibre-optic channel (152) comprising an input (156) for receiving an input signal (Sin) from a sensor (154) which is coupled to the fibre-optic channel (152), a clock recovery circuit (120) according to claim 6 coupled to the input (156) for receiving said input signal (Sin) as a reference signal, a data recovery circuit (158) coupled to said clock recovery circuit (120) and the input (156), for generating a digital output signal (Sout) in response to the input signal (Sin), and an output signal (CL) of the clock recovery circuit (120), and an output (160) for providing the digital output signal (Sout).

* * * * *